United States Patent [19]
Myrosznyk et al.

[11] Patent Number: 5,041,188
[45] Date of Patent: Aug. 20, 1991

[54] HIGH TEMPERATURE SUPERCONDUCTOR DETECTOR FABRICATION PROCESS

[75] Inventors: James M. Myrosznyk, Santa Barbara; Jerry A. Wilson; Michael Ray, both of Goleta, all of Calif.

[73] Assignee: Santa Barbara Research Center, Goleta, Calif.

[21] Appl. No.: 537,200

[22] Filed: Jun. 12, 1990

Related U.S. Application Data

[62] Division of Ser. No. 317,716, Mar. 2, 1989.

[51] Int. Cl.$^5$ .......................... B44C 1/22; C23F 1/02; C03C 15/00; B29C 37/00
[52] U.S. Cl. ..................... 156/634; 156/643; 156/651; 156/656; 156/659.1; 156/667; 505/728; 505/820
[58] Field of Search ............... 156/634, 643, 650, 656, 156/659.1, 661.1, 651, 664, 667, 668; 427/62, 63; 204/192.24, 192.34, 192.35, 192.36; 505/816, 728, 817, 820; 29/599

[56] References Cited

U.S. PATENT DOCUMENTS

| 3,325,319 | 6/1967 | Frantzen | 29/424 X |
| 3,384,957 | 5/1968 | Shannon | 29/424 X |
| 3,461,550 | 8/1969 | Aklufi | 437/228 X |
| 3,600,235 | 8/1971 | Okumura | 437/228 X |
| 3,875,777 | 4/1975 | Kelley | 29/424 X |
| 4,439,269 | 3/1984 | Cukauskas | 156/643 |
| 4,581,099 | 4/1986 | Fukaya et al. | 437/228 X |
| 4,933,318 | 6/1990 | Heijman | 156/643 X |
| 4,971,948 | 11/1990 | Dam et al. | 505/728 X |

FOREIGN PATENT DOCUMENTS 60-88483  5/1985  Japan ..................... 29/599
64-89483  4/1989  Japan ..................... 505/728

OTHER PUBLICATIONS

"High Tc Superconductors—Composite Wire Fabrication", Jin et al., Applied Physics Letter, vol. 51, No. 3, 20 Jul. 1987.

Primary Examiner—William A. Powell
Attorney, Agent, or Firm—W. C. Schubert; W. K. Denson-Low

[57] ABSTRACT

A high temperature superconductor (HTS) fabrication process employs a two level metal deposition sequence for depositing a layer of metal (14, 18) over HTS material (12) to protect the HTS material from subsequent, possibly deleterious, processing steps. The process of the invention provides a capability for both patterning a HTS film material and electrically contacting the film using conventional photolithographic processes. The process of the invention furthermore accomplishes these objectives without degrading the superconducting properties of the film. The two level metal process protects the film from aqueous based processes such as photoresist development. The two level metal process furthermore does not require processes such as aqueous based chemical etching or ion milling of the surfaces of the superconducting film, thereby eliminating at least two processes which are known to degrade the superconducting properties of HTS material.

10 Claims, 1 Drawing Sheet

HIGH TEMPERATURE SUPERCONDUCTOR DETECTOR FABRICATION PROCESS

This is a division of application Ser. No. 317,716 filed Mar. 2, 1989.

FIELD OF THE INVENTION

This invention relates generally to high temperature superconductor (HTS) fabrication and, in particular, to a fabrication process which facilitates the fabrication of HTS devices and circuits using readily available fabrication techniques and processes of the type employed to process conventional semiconductor circuits.

BACKGROUND OF THE INVENTION

At present there are a variety of processes that are employed or that are under development in the field of HTS thin film processing. Some of these processes, such as wet chemical etching techniques, are relatively unsophisticated and readily accomplished. However, wet chemical etching techniques are known to be potentially deleterious to the electrical properties of the HTS film. Other, more sophisticated, techniques such as laser ablation and ion implantation require a substantial capital investment in the required processing equipment.

It is therefore one object of the invention to provide a HTS fabrication process that is relatively simple and which utilizes known processes and processing equipment that are generic to most semiconductor processing facilities.

It is another object of the invention to provide a HTS fabrication process which does not degrade the electrical properties of the HTS material.

It is a still further object of the invention to provide a HTS fabrication process which beneficially protects the HTS material with at least one layer of metalization and which therefore isolates the HTS material from contact with a processing solution.

SUMMARY OF THE INVENTION

The foregoing problems are overcome and the objects of the invention are realized by a HTS fabrication process which employs, in accordance with the invention, a two level metal deposition sequence. The process of the invention provides a capability for both patterning a HTS film and electrically contacting the film using conventional photolithographic processes. The process of the invention furthermore accomplishes these important objectives without degrading the superconducting properties of the film. The two level metal process protects the film from aqueous based processes such as photoresist development. The two level metal process furthermore does not require processes such as aqueous based chemical etching or ion milling of the surfaces of the superconducting film, thereby eliminating at least two processes which are known to degrade the superconducting properties of a HTS film layer.

In accordance with the invention there is disclosed a method of processing an electrical device which includes HTS material such that the electrical properties of the HTS material are not significantly impaired by a subsequent processing step which may impair the electrical properties of the HTS material. The method includes the steps of first depositing a layer of metal upon an exposed surface or surfaces of the HTS material and thereafter performing the subsequent processing step.

BRIEF DESCRIPTION OF THE DRAWINGS

The foregoing and other aspects of the invention will be made more apparent in the ensuing detailed description of the Invention when read in conjunction with the attached Drawing, wherein.

DETAILED DESCRIPTION OF THE INVENTION

The particular electronic devices for which the following novel process is disclosed are broadband long wavelength infrared detectors. However, it should be realized that the process is applicable to the fabrication of many types of electronic devices which have a requirement for patterning a HTS film and/or for forming an electrical contact to discrete elements within the patterned film. The disclosed process is relatively simple to accomplish and does not require complex processing techniques nor does the process require specialized processing equipment not already in use in a typical semiconductor fabrication facility. In addition, the process specifically avoids those types of processing situations which are known to degrade HTS electrical performance.

Figure 1A:
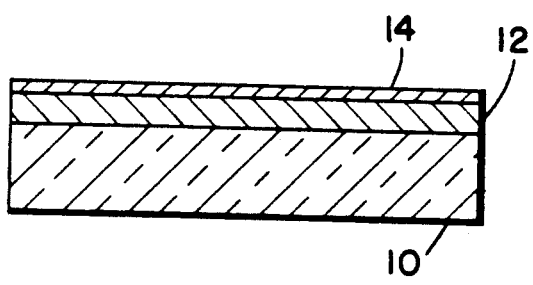
FIGS. 1a-1f illustrate various steps of a two level metal process of the invention, FIGS. 1a-1f not being drawn to scale.

Referring first to FIG. 1a a substrate 10 having a HTS film layer 12 overlying a surface thereof is provided. The substrate may be any type of substrate material which is known to be useful with HTS material. One example is a substrate comprised of MgO. The HTS film may be comprised of a suitable HTS material such as, by example, $Y_1Ba_2Cu_3O_{7-x}$. Over the surface of film layer 12 is vacuum deposited a metal layer 14 which is comprised of a metal known to have good electrical and physical contacting properties with a HTS film. Two examples of such metals are gold and silver. In that the next step involves an aqueous development of a photoresist material the vacuum deposited metal layer 14 must be of sufficient thickness and density so as to be impervious to the water used in the aqueous development of the photoresist. By example, a metal layer 14 thickness of approximately 3000 angstroms has been found to adequately protect the HTS film layer 12 during the aqueous development of photoresist.

Figure 1B:
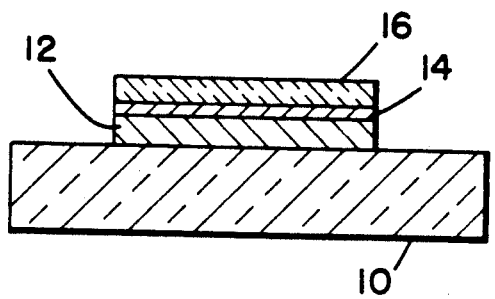

Referring to FIG. 1b a standard photoresist process is employed to apply a layer 16 of photoresist over the metal layer 14, the photoresist being applied so as to define a pattern required for the device. As was previously noted an aqueous development of the photoresist is acceptable for this step in that the water sensitive HTS film layer 12 is protected by the metal layer 14. Next, using the -photoresist 16 pattern as a protective mask, an ion mill is employed to mill through the unprotected metal layer 14 and the underlying HTS film layer 12 until all of the metal and the underlying HTS film exposed to the ion beam is etched away. As seen in FIG. 1b, there is left upstanding on the surface of the substrate 10 a layered structure including a portion of the HTS layer 12. It should be noted that although ion milling directly upon the surface of a HTS film may degrade the film's electrical properties, it is only the immediate edges of the masked HTS layer 12 which might be affected by the ion milling. The bulk of the HTS film layer 12 is protected by the overlying metal layer 14 and photoresist 16.

Figure 1C:
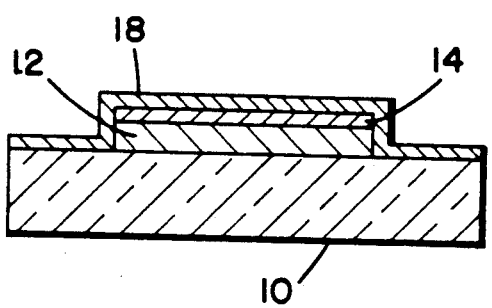

Referring to FIG. 1c the protective photoresist layer 16 is stripped away with, for example, either organic solvents or by a plasma etching in oxygen technique. There is then vacuum deposited a second metal layer 18 which is preferably comprised of the same metal as that previously used to form the layer 14. The second metal layer 18 is deposited over the surface of the patterned HTS film layer 12 and the overlying first layer of metal 14, as well as the exposed substrate 10. The thickness of the second metal layer 18 is preferably equal to the thickness of the first metal layer 14 in order to isolate the exposed edges of the HTS film layer 12 from a subsequent photoresist development step.

Figure 1D:
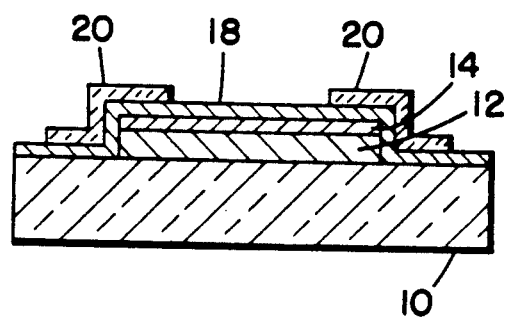

Referring to FIG. 1d there is next applied a second photoresist layer 20 in a pattern complementary to the first such that, after the second layer 20 of photoresist is deposited, those regions on the device surface where contact metal is required are covered by the second layer 20 of photoresist. Aqueous development of this photoresist pattern is also acceptable in that the patterned HTS film layer 12 as well as the substrate 10 are protected by the metal film layers 14 and/or 18.

Figure 1E:
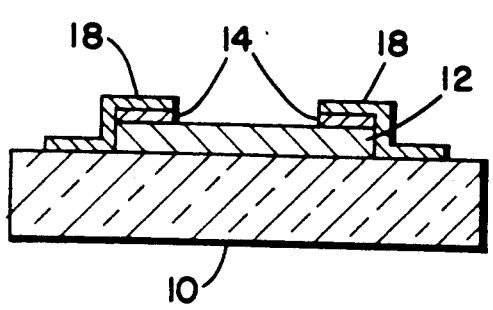

Referring to FIG. 1e an appropriate process gas, such as FREON TM 13, in a plasma etch system is employed to etch away the metal of layers 14 and 18 which are not protected by the photoresist pattern of photoresist layer 20. It should be noted that the process gas and the operating parameters of the plasma system are optimized to etch away the unwanted metal completely while having a low or negligible etch rate on the HTS film layer 12. In accordance with this example, Freon TM 13 is one such process gas which is known to selectively etch Au while not significantly etching HTS material. After the plasma etching step is completed the photoresist layer 20 is stripped with, for example, organic solvents or by plasma etching in oxygen gas.

Figure 1F:
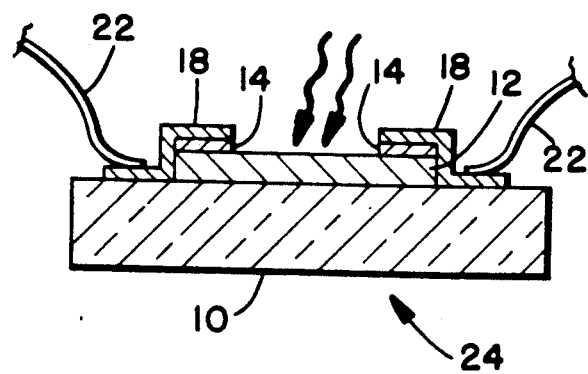

Referring to FIG. 1f wires 22 are connected, such as by being ultrasonically bonded, to a portion of the metal layer 18 for conductively coupling through the layer 18 and to the HTS film layer 12 to form an operational photodetecting device 24. Radiation, indicated by the arrows A, incident upon the HTS layer 12 in the manner shown is absorbed therein resulting in a detectable electrical signal.

The process disclosed above has been successfully employed on a variety of HTS films of differing composition which were deposited by a variety of different techniques. Each of the HTS films were evaluated prior to processing for determining the film's superconducting properties. This evaluation included measuring the film's resistance versus temperature characteristic and plotting the resulting data graphically. The graph was employed to obtain pertinent information relating to $T_{onset}$, $T_{zero}$ and transition widths, all of which are critical parameters relating to the HTS film's superconducting properties. Similarly, after the HTS film layer was processed in a manner disclosed above an identical resistance versus temperature test was conducted on a portion of the same HTS film that was previously characterized. For all devices evaluated in this fashion those superconducting properties which are determinable with this particular type of test have been found to be preserved, without any detectable evidence of degradation resulting from the intervening processing steps.

Based on the foregoing disclosure those having skill in the art may derive modifications to the process of the invention. As such, the invention is not to be considered to be limited solely to the specific parameters and materials disclosed above, but is instead intended to be limited only by the claims which follow.

What is claimed is:

1. A method of processing an electrical device which includes HTS material such that the electrical properties of the HTS material are not significantly impaired, comprising the steps of:
   providing a substrate having a layer of HTS material upon a surface thereof;
   depositing a first layer of metal over a surface of the HTS material;
   depositing a first masking layer over selected portions of the first metal layer in a pattern for defining a desired shape of a HTS electrical device, portions of the first masking layer having openings therethrough for exposing portions of the underlying first metal layer;
   removing the exposed portions of the first metal layer and any HTS material which underlies the exposed portions of the first metal layer to expose the underlying surface of the substrate;
   removing the first masking layer;
   depositing a second layer of metal over the exposed surface of the substrate and over unremoved surfaces of the first metal layer;
   depositing a second masking layer over selected portions of the second metal layer in a pattern for further defining the desired shape of the HTS electrical device, portions of the second masking layer having openings therethrough for exposing portions of the underlying second metal layer;
   removing the exposed portions of the second metal layer; and
   removing the second masking layer.

2. A method as set forth in claim 1 wherein the steps of depositing the first and the second metal layers are accomplished by vacuum depositing the metal layers to a predetermined thickness.

3. A method as set forth in claim 2 wherein the predetermined thickness is approximately 3000 angstroms or greater.

4. A method as set forth in claim 1 wherein the steps of depositing a first and a second masking layer are accomplished by applying a layer of photoresist.

5. A method as set forth in claim 4 wherein the steps of removing the first and the second masking layers are accomplished by stripping the first and the second masking layers with an organic solvent.

6. A method as set forth in claim 4 wherein the steps of removing the first and the second masking layers are accomplished by stripping the first and the second masking layers by a plasma etching in oxygen technique.

7. A method as set forth in claim 1 wherein the step of removing the exposed portions of the first metal layer is accomplished by an ion filling technique.

8. A method as set forth in claim 1 wherein the step of removing the exposed portions of the second metal layer is accomplished by a plasma etching technique which employs a process gas selected for a property of having a low etch rate of the HTS material.

9. A method as set forth in claim 1 and further comprising a step of bonding electrical conductors to exposed portions of the second metal layer in order to conductively couple the HTS material to an external circuit.

10. A method as set forth in claim 9 wherein the step of bonding is accomplished by an ultrasonic wire bonding technique.

* * * * *